(12) United States Patent
Wang et al.

(10) Patent No.: US 10,466,311 B2
(45) Date of Patent: Nov. 5, 2019

(54) HALL EFFECT SENSOR CIRCUIT WITH OFFSET COMPENSATION

(71) Applicant: The Timken Company, North Canton, OH (US)

(72) Inventors: Lei Wang, Solon, OH (US); Alfred J. Santos, Keene, NH (US); Mark E. Lacroix, Winchester, NH (US)

(73) Assignee: The Timken Company, North Canton, OH (US)

( * ) Notice: Subject to any disclaimer, the term of this patent is extended or adjusted under 35 U.S.C. 154(b) by 159 days.

(21) Appl. No.: 15/508,121

(22) PCT Filed: Sep. 4, 2014

(86) PCT No.: PCT/US2014/054037
§ 371 (c)(1),
(2) Date: Mar. 2, 2017

(87) PCT Pub. No.: WO2016/036372
PCT Pub. Date: Mar. 10, 2016

(65) Prior Publication Data
US 2017/0248662 A1    Aug. 31, 2017

(51) Int. Cl.
*G01R 33/00* (2006.01)
*G01R 33/07* (2006.01)

(52) U.S. Cl.
CPC ....... *G01R 33/0029* (2013.01); *G01R 33/075* (2013.01)

(58) Field of Classification Search
CPC .... G01R 33/07; G01R 33/077; G01R 33/072; G01R 33/075; G01R 33/0029; G01R 15/202
(Continued)

(56) References Cited

U.S. PATENT DOCUMENTS

| 4,373,271 A | * | 2/1983 | Nitz | G01C 17/28 |
| | | | | 324/251 |
| 4,737,710 A | * | 4/1988 | Van Antwerp | G01D 5/147 |
| | | | | 324/207.2 |

(Continued)

FOREIGN PATENT DOCUMENTS

| CN | 101504292 | 8/2009 |
| CN | 201408199 | 2/2010 |

(Continued)

OTHER PUBLICATIONS

Jiang et al., "A Continuous-Time Ripple Reduction Technique for Spinning-Current Hall Sensors," IEEE Journal of Solid-State Circuits, 2014, vol. 49, No. 7, pp. 1525-1534.
(Continued)

*Primary Examiner* — Christopher P McAndrew
(74) *Attorney, Agent, or Firm* — Michael Best & Friedrich LLP

(57) ABSTRACT

A method and apparatus for sensing magnetic field strength with a pair of Hall effect sensors includes sampling a sensed voltage for the Hall effect sensors during a first phase and combining the sensed voltage. During a second phase, obtaining sensed voltages for the Hall effect sensors and combining the sensed voltages. The sensed voltages from the first phase and the second phase are combined to obtain a summed voltage and remove the Hall effect sensor and amplifier offset error value. In one arrangement, the summed voltage corresponds to the sensed Hall voltage of the first Hall effect sensor added to the Hall voltage of the second Hall effect sensor. In another arrangement, the summed voltage corresponds to the sensed Hall voltage of the first Hall effect sensor subtracted by the sensed Hall voltage of the second Hall effect sensor. Changes in the summed voltage with respect to a reference voltage are counted to
(Continued)

determine the speed of a rotating shaft having magnets or a similar arrangement.

30 Claims, 7 Drawing Sheets

(58) Field of Classification Search
USPC ........................................................ 324/251
See application file for complete search history.

(56) References Cited

U.S. PATENT DOCUMENTS

| | | | |
|---|---|---|---|
| 4,954,812 A * | 9/1990 | Lebron | G01R 33/07 324/260 |
| 5,621,319 A * | 4/1997 | Bilotti | G01R 33/07 324/225 |
| 6,772,647 B2 | 8/2004 | Hwang | |
| 6,871,554 B2 | 5/2005 | Duret et al. | |
| 7,093,505 B2 | 8/2006 | Denny et al. | |
| 7,106,053 B2 | 9/2006 | Desboilles | |
| 7,108,427 B2 | 9/2006 | Joki et al. | |
| 7,225,692 B2 | 6/2007 | Ulrici et al. | |
| 7,285,949 B2 | 12/2007 | Burns et al. | |
| 7,304,473 B2 | 12/2007 | Kuroyanagi | |
| 7,307,415 B2 | 12/2007 | Seger et al. | |
| 7,493,831 B2 | 2/2009 | Varonis | |
| 7,579,827 B2 | 8/2009 | Burns et al. | |
| 7,600,138 B2 | 10/2009 | Santos | |
| 7,780,357 B2 | 8/2010 | Varonis | |
| 7,902,820 B2 | 3/2011 | Vervaeke | |
| 7,999,533 B2 | 8/2011 | LaCroix | |
| 7,999,536 B2 | 8/2011 | Santos et al. | |
| 8,058,868 B2 | 11/2011 | Santos et al. | |
| 2009/0009164 A1 * | 1/2009 | Utsuno | G01R 33/07 324/251 |
| 2012/0223704 A1 | 9/2012 | Hayashi | |
| 2012/0274381 A1 | 11/2012 | Pyo et al. | |
| 2013/0193962 A1 * | 8/2013 | Okatake | G01R 33/075 324/251 |
| 2014/0028286 A1 | 1/2014 | Hu et al. | |
| 2014/0145714 A1 | 5/2014 | Okatake et al. | |
| 2014/0306692 A1 | 10/2014 | Santos et al. | |
| 2015/0084620 A1 | 3/2015 | Hikichi et al. | |

FOREIGN PATENT DOCUMENTS

| | | |
|---|---|---|
| CN | 201764980 | 3/2011 |
| CN | 102820860 A | 12/2012 |
| DE | 19650184 A1 | 6/1997 |
| EP | 0283291 | 9/1988 |
| EP | 0620647 | 10/1994 |
| EP | 1471331 | 10/2004 |
| EP | 1606589 | 6/2010 |
| FR | 2772912 | 6/1999 |
| JP | H09196699 A | 7/1997 |
| JP | 2001337147 A | 12/2001 |
| JP | 2005274491 A | 10/2005 |
| JP | 2011169811 A | 9/2011 |
| JP | 2012181128 A | 9/2012 |
| JP | 2013178229 A | 9/2013 |
| JP | 2013253886 A | 12/2013 |
| KR | 1020120121779 A | 11/2012 |
| WO | 2008048379 A1 | 4/2008 |
| WO | 2010/082086 | 7/2010 |
| WO | 2010/117891 | 10/2010 |
| WO | 2013111521 A1 | 5/2015 |

OTHER PUBLICATIONS

International Search Report and Written Opinion for Application No. PCT/US20141054037 dated Apr. 24, 2015 (14 pages).
Popovic et al., "Hall Effect Devices," Second Edition, 2003.
The Timken Company, "MPS160 Multiplying Encoder ASIC Device Specification," Oct. 16, 2008, retrieved from the internet: URL:http://www.timken.com/EN-US/products/motion/products/speeddirection/Documents/mps-160-linear-encoder-asic-device-specification.pdf, [retrieved Jun. 10, 2015],18 pages.
International Search Report and Written Opinion for Application No. PCT/US2012/061815 dated Apr. 11, 2013 (16 pages).
Korean Patent Office Action for Application No. 10-2017-7005967 dated Feb. 27, 2018 (18 pages, English translation included).
German Patent Office Action for Application No. 112014006927.2 dated Jan. 22, 2018 (21 pages, English translation included).
Japanese Patent Office Action for Application No. 2017-512904 dated Mar. 2, 2018 (12 pages, English translation included).
Chinese Patent Office Action for Application No. 201480083206.3 dated Mar. 5, 2019 (18 pages, English translation included).

* cited by examiner

HALL EFFECT SENSOR CIRCUIT WITH OFFSET COMPENSATION

BACKGROUND

The present invention relates to a Hall effect sensor circuit arrangement including a Hall effect sensor that provides offset compensation.

Use of a Hall effect sensor to detect a magnetic field is known. A circuit alternatively samples terminals of the Hall effect sensor at 0 degrees and 90 degrees orientation. Such a technique is known as current spinning. In order to attempt to reduce an offset voltage error, which can be caused by factors such as mechanical stress, temperature change or manufacture misalignment, a cross-shaped Hall effect sensor is utilized. A low pass filter, however, is required to remove voltage ripples that represent the offset error from the output of the Hall effect sensor. Thus, response speed is limited by the low pass filter.

SUMMARY

In one embodiment, the invention provides a method for sensing a magnetic field with at least one Hall effect sensor connected to a Hall effect sensing circuit, the method comprising the steps of: applying a drive current to the at least one Hall effect sensor during a first phase; sampling a sensed phase one voltage for the at least one Hall effect sensor during the first phase; providing the sensed phase one voltage to an amplifier; outputting from the amplifier a positive voltage output of the sensed phase one voltage and a negative voltage output of the sensed phase one voltage to a hold circuit during the first phase, the positive voltage output and the negative voltage output corresponding to a magnetic field strength value and a Hall effect sensor and amplifier offset error value; switching terminals of the at least one Hall effect sensor and applying the drive current to different terminals of the at least one Hall effect sensor to begin a second phase; sampling a sensed phase two voltage for the at least one Hall effect sensor during the second phase at the different terminals of the at least one Hall effect sensor than during the first phase; providing the sensed phase two voltage to the amplifier; outputting from the amplifier a positive voltage output of the sensed phase two voltage and a negative voltage output of the sensed phase two voltage to the hold circuit during the second phase, the positive voltage output and the negative voltage output corresponding to a magnetic field strength value and a Hall effect sensor and amplifier offset error value; and summing the positive and negative voltages from the first phase with the positive and negative voltages from the second phase to remove the Hall effect sensor and amplifier offset error value and to obtain a summed voltage corresponding to a summed magnetic field strength value.

In one embodiment, the at least one hall effect sensor comprises a first one of at least one pair of Hall effect sensors, wherein the summed magnetic field strength value corresponds to the Hall voltage of the first one of the pair of Hall effect sensors added to the Hall voltage of the second one of the pair of Hall effect sensors.

One embodiment includes the steps of subsequent to obtaining the summed magnetic field strength value: holding the summed voltage corresponding to the summed magnetic field strength value for a next first phase, and switching the terminals of the Hall effect sensor to correspond to the terminals of the first phase and applying the drive current to the at least one Hall effect sensor for repeating the first phase, and wherein repeating the first phase includes repeating the steps of: sampling a sensed phase one voltage for the at least one Hall effect sensor during the first phase; providing the sensed phase one voltage to an amplifier; and outputting from the amplifier a positive voltage output of the sensed phase one voltage and a negative voltage output of the sensed phase one voltage to a hold circuit during the first phase, the positive voltage output and the negative voltage output corresponding to a magnetic field strength value and a Hall effect sensor and amplifier offset error value.

In another embodiment, the step of outputting from the amplifier a positive voltage output of the sensed phase two voltage and a negative voltage of the sensed phase two voltage to the hold circuit during the second phase comprises: switching the positive voltage output and the negative voltage output so the negative voltage output during the second phase is provided to a first input of the hold circuit that receives the positive voltage output during the first phase and so that the positive voltage output during the second phase is provided to a second input of the hold circuit that receives the negative voltage output during the first phase; and wherein the step of summing the positive output and negative output voltages from the first phase with the positive output and negative output voltages from the second phase to remove the Hall effect sensor and amplifier offset error value and to obtain a summed voltage corresponding to a summed magnetic field strength value comprises: providing the voltage from the first input of the hold circuit to a negative input of an operational amplifier; providing the voltage from the second input of the hold circuit to a positive input of the operational amplifier; and providing the summed voltage corresponding to the summed magnetic field strength value as an output of the operational amplifier.

In one embodiment, the invention provides a method for sensing a magnetic field with at least one pair of Hall effect sensors connected to a Hall effect sensing circuit, the method includes the steps of: applying a drive current to at least one pair of Hall effect sensors during a first phase; sampling a sensed voltage for each of the Hall effect sensors during the first phase; combining the sensed voltages from the Hall effect sensors during the first phase to obtain a first combined sensed voltage corresponding to a magnetic field strength value and Hall effect sensor and amplifier offset error value; switching terminals of the Hall effect sensors and applying the drive current to different terminals of the at least one pair of Hall effect sensors to begin a second phase; sampling a sensed voltage for each of the Hall effect sensors during the second phase at different terminals of the at least one pair of Hall effect sensors than during the first phase; combining the sensed voltages from the Hall effect sensors during the second phase to obtain a second combined sensed voltage corresponding to a magnetic field strength value and a negative Hall effect sensor and amplifier offset error value, and summing the first combined sensed voltage from the first phase with the second combined sensed voltage during the second phase to remove the Hall effect sensor and amplifier offset error value and to obtain a summed voltage corresponding to a summed magnetic field strength value. Another embodiment includes the additional steps of, subsequent to obtaining the summed magnetic field strength value, holding the combined sensed voltage for a next first phase, switching the terminals of the Hall effect sensors to correspond to the terminals of the first phase and applying the drive current to the at least one pair of Hall effect sensors for repeating the first phase. Repeating the first phase includes repeating the steps of sampling the sensed voltage for each of the Hall effect sensors during the first phase, and combining the sensed voltages from the Hall effect sensors during the first phase to obtain the first combined voltage corresponding to a magnetic field strength value and Hall effect sensor and amplifier offset error value.

In one embodiment, with at least one pair of Hall effect sensors, the summed magnetic field strength value corresponds to the Hall voltage of a first one of the pair of Hall effect sensors added to the Hall voltage of the second one of the pair of Hall effect sensors. In another embodiment, the summed magnetic field strength value corresponds to the Hall voltage of a first one of the pair of Hall effect sensors subtracted by the Hall voltage of the second one of the pair of Hall effect sensors.

Another embodiment includes two or more pairs of the Hall effect sensors, wherein the sensed voltages of the pairs of the Hall effect sensors are combined.

In another embodiment, the invention provides a Hall effect sensing circuit arrangement comprising: first and second Hall effect sensors having terminals; first and second amplifiers; a first switching unit configured to selectively connect the terminals of the first Hall effect sensor to inputs of the first amplifier, and the first switching unit configured to selectively connect the terminals of the second Hall effect sensor to inputs of the second amplifier; first and second adders for receiving outputs from the first and second amplifiers; a second switching unit configured to connect the first adder to a hold circuit and alternately to connect the second adder to the hold circuit, wherein the hold circuit comprises capacitors; an output amplifier for receiving a voltage input from the hold circuit and the adders to obtain a combined sensed voltage, and a controller configured to control the first switching unit and the second switching unit. In one embodiment, the controller is configured to operate the sensing circuit arrangement in a first phase and a second phase by periodically changing a state of the first switching unit and the second switching unit, and changing a state of switches in the hold circuit essentially simultaneously with the changing of the states of the first switching unit and the second switching unit.

In one embodiment, the first adder receives a positive output from the first amplifier and a negative output from the second amplifier, and the second adder receives a positive output from the second amplifier and a negative output from the first amplifier. In a second embodiment, the first adder receives a positive output from the first amplifier and a positive output from the second amplifier, and the second adder receives a negative output from the second amplifier and a negative output from the first amplifier. In another embodiment, the sensing circuit arrangement is free from a low pass filter or uses a low pass filter with a higher cut off frequency.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
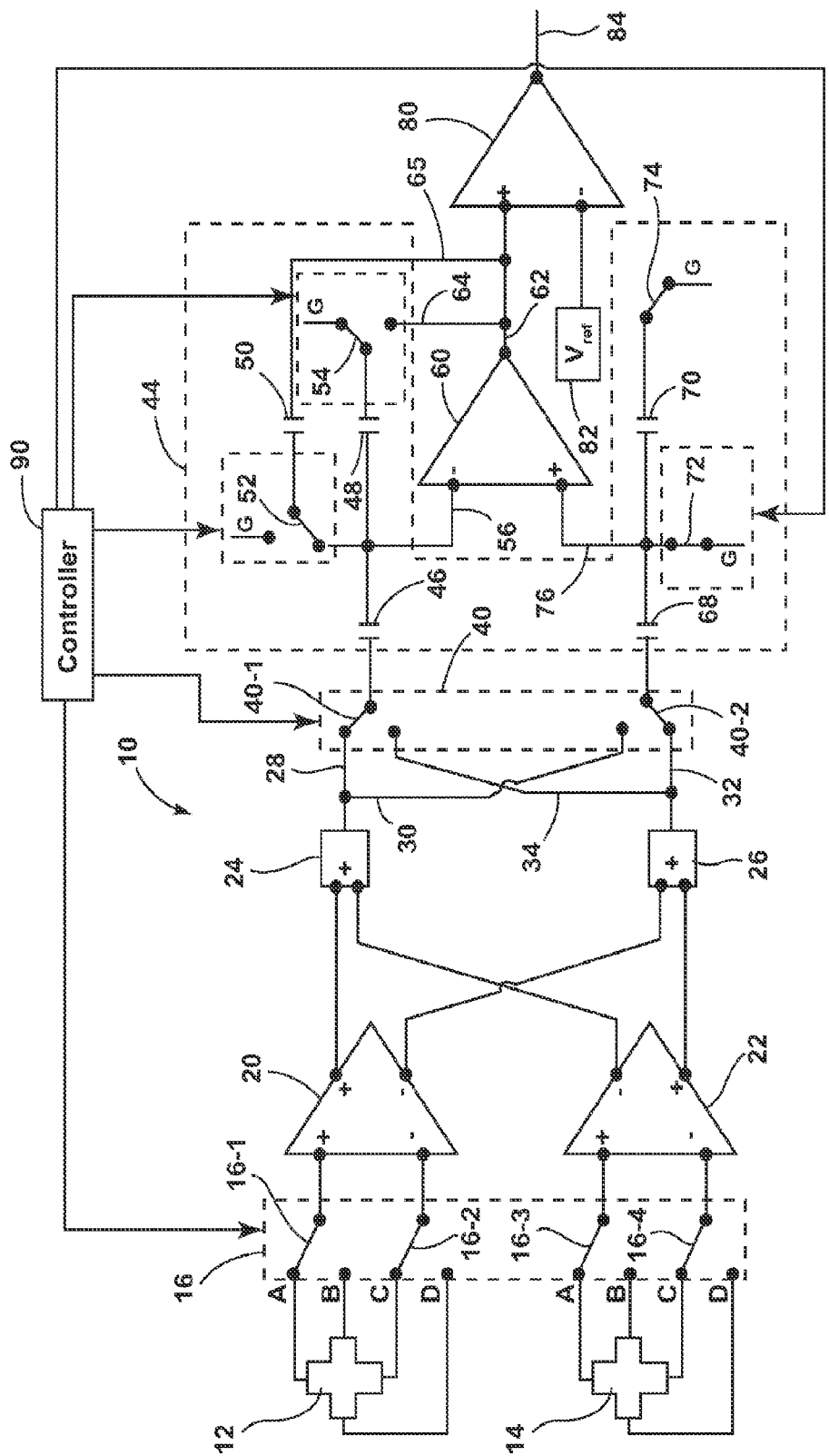
FIG. 1 shows an embodiment of a Hall sensor circuit arrangement during a first phase.

FIG. 1 shows a Hall effect sensor circuit arrangement 10 that provides offset compensation. In FIG. 1, a pair of cross-shaped Hall effect sensors 12, 14 sense the presence/absence and strength of a magnetic field. The Hall effect sensors 12, 14 include terminals A-D connected to four arms thereof. A switch unit 16 includes a first pair of switches 16-1, 16-2 that connect the terminals A-D of the Hall effect sensor 12 to an operational amplifier 20. A bias circuit (not shown) connects to terminal C-A to provide bias current flowing from terminal C to terminal A. Further, the switch unit 16 includes a second pair of switches 16-3, 16-4 that connect the terminals A-D of the Hall effect sensor 14 to an operational amplifier 22 as shown in FIG. 1. The operational amplifiers 20, 22 each include a positive and a negative input terminal, along with a positive and a negative output terminal.

The Hall effect sensor circuit arrangement 10 includes a pair of adders 24, 26, each having a pair of inputs and an output. The adder 24 adds the positive output of the amplifier 20 with the negative output of the operational amplifier 22. The adder 26 adds the negative output of the operational amplifier 20 with the positive output of the operational amplifier 22.

The output of the adder 24 shown in FIG. 1 is provided with two signal paths, shown as two adder output electrical connectors or wires 28, 30. Likewise, the output of the adder 26 branches out to provide two adder output electrical connectors or wires 32, 34. As shown in the Hall effect sensor circuit of FIG. 1, a switch unit 40 includes a first switch 40-1 that is selectively connectable to either the adder output connector 28 or the adder output connector 34 of the adder 26. The switch unit 40 includes a second switch 40-2 that is selectively connectable to either the adder output connector 32 of the adder 26 or the adder output connector 30 of the adder 24.

In FIG. 1, the output of the switch 40-1 connects to a hold circuit 44. The hold circuit 44 includes capacitors 46, 48, 50 and switches 52, 54. As shown in FIG. 1, an output connector 56 of the hold circuit 44 connects to a negative input terminal of an operational output amplifier 60 that includes an output connector or signal line 62. Further, electrical connectors 64, 65 of the hold circuit 44 connect to the signal line 62.

The hold circuit 44 shown in FIG. 1 also includes a pair of capacitors 68, 70 and a switch 72. A switch 74 shown within the hold circuit 44 remains in the closed position throughout operation of the sensor circuit arrangement 10, and thus is not considered a component thereof. An output connector 76 of the hold circuit 44 connects to the positive input of the operational output amplifier 60. In FIG. 1, "G" is an abbreviation for a ground terminal.

The output of the operational amplifier 60 connects to an input of a comparator 80. A voltage reference generator 82 connects to the other input of the comparator 80. The comparator 80 provides an output signal 84.

The Hall effect sensor circuit arrangement 10 includes a controller 90 that is connected to the switch unit 16, the switch unit 40, the switch 52, the switch 54 and the switch 72. The controller 90 is configured to control the states of the switch units 16, 40 and the switches 52, 54, 72.

Figure 2:
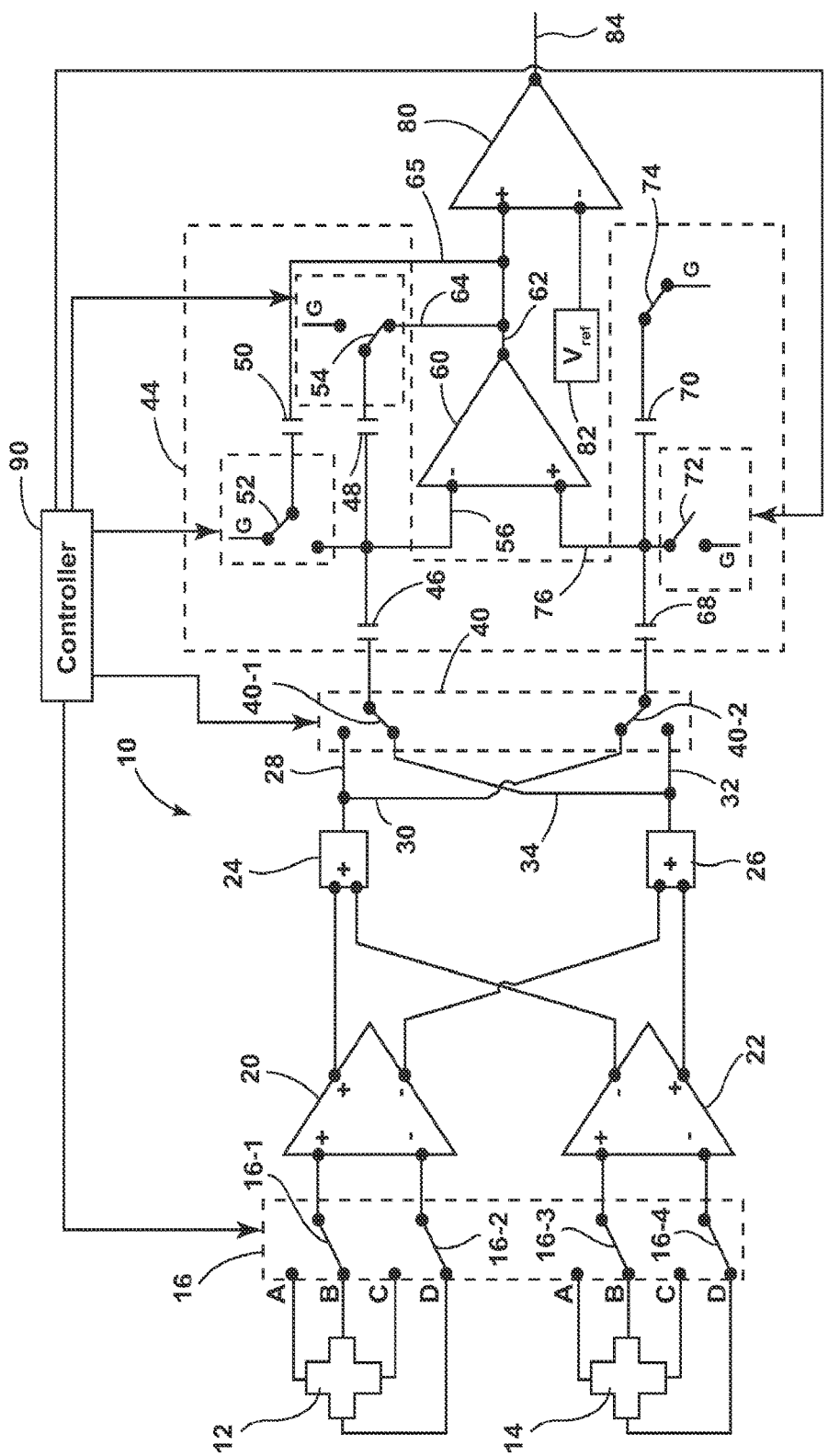
FIG. 2 shows the Hall sensor circuit arrangement of FIG. 1 during a second phase.

FIG. 1 shows the Hall effect sensor circuit arrangement 10 in a sensing phase one, wherein sensing occurs with the switch units 16, 40 and the switches 52, 54, 72 in the states as shown. FIG. 2 shows the Hall effect sensor circuit arrangement 10 in sensing phase two, wherein the states of the switch units and switches are changed or switched by the controller 90 to opposite states as compared to the states shown in FIG. 1. The sensor circuit arrangement 10 shown in FIGS. 1 and 2 obtains a difference signal value that is the difference in the magnetic field strengths of the Hall effect sensor 12 and the Hall effect sensor 14.

Operation

The Hall effect sensor circuit arrangement 10 shown in FIG. 1 operates as follows. The operational amplifier 20 receives voltage signals from terminal A and terminal C of the Hall effect sensor 12 via respective switches 16-1 and 16-2. The operational amplifier 20 provides a positive output on the positive terminal of amplifier 20 that is defined by the equation: V1(phase one)=Vhall1+Voffset1, wherein V1 is the sensed voltage of the amplifier 20 during phase one, and wherein Vhall1 is the Hall voltage value and Voffset1 is a voltage offset value of the sensed voltage of the Hall effect sensor 12 and amplifier 20 during sampling phase one. Thus, the measured voltage V1(phase one) corresponds to a magnetic field strength value and Hall effect sensor and amplifier offset error value for the Hall effect sensor 12 during phase one.

At the same time, the operational amplifier 22 receives voltage signals from terminal A and terminal C of the Hall effect sensor 14 via respective switches 16-3 and 16-4. The operational amplifier 22 provides a positive output on the positive terminal of amplifier 22 that is defined by the equation: V2(phase one)=Vhall2+Voffset2, wherein V2 is the sensed voltage of the amplifier 22 during phase one, and wherein Vhall2 is the Hall voltage value and Voffset2 is a voltage offset value of the sensed voltage of the Hall effect sensor 14 during sampling phase one. Thus, the measured voltage V2(phase one) corresponds to a magnetic field strength value and Hall effect sensor and amplifier offset error value for the Hall effect sensor 14 during phase one.

Thereafter, adder 24 adds the positive voltage output V1(phase one) from amplifier 20 with the negative voltage output from amplifier 22 for V2(phase one) as the adder is connected to the negative output terminal of the amplifier 22. Thus, the adder 24 provides an output signal defined by the equation: Vp(phase one)=(Vhall1−Vhall2)+(Voffset1−Voffset2), wherein Vp represents the added voltage output of adder 24. Thus, the combined sensed voltage Vp for phase one corresponds to a magnetic field strength value and Hall sensor and amplifier offset error value.

At the same time, adder 26 adds the positive voltage output V2(phase one) from amplifier 22 with the negative voltage output for V1(phase one) as the adder is connected to the negative output terminal of the amplifier 20. Thus, the adder 26 provides an output signal defined by the equation: Vn(phase one)=−(Vhall1−Vhall2)−(Voffset1−Voffset2), wherein Vn represents the added voltage output from adder 26. The combined sensed voltage Vn(phase one) corresponds to a magnetic field strength value and an offset error value.

As shown in FIG. 1, the voltage output Vp(phase one) from the adder 24 passes through switch 40-1 of switch unit 40 to the hold circuit 44 during phase one. With the switch 54 connected to an electrical ground (GND) during phase one, the voltage Vp is provided to capacitors 46, 48 provided in series. Between the capacitors 46, 48 the hold circuit 44 has an output connection 56 to a negative input terminal of the operational amplifier 60. The capacitor 46 receives and holds the voltage output Vp that is provided to the amplifier 60 as a generally constant voltage value. The capacitor 48 is connected to GND via switch 54 and discharges during phase one. At the same time, the switch 72 of the hold circuit 44 is positioned to connect ground GND to the output connector 76 that connects with the positive input of the operational amplifier. Thus, the capacitor 70 is discharging during phase one, along with the capacitor 48.

Further, as shown in FIG. 1, during the first phase the output of the amplifier 60 is in a voltage hold condition wherein the voltage across capacitor 50 receives and maintains the output voltage from a previous completion of phase two. For purposes of discussion, amplifier gains are ignored in the equations.

Phase Two

As shown in FIG. 2, the controller 90 switches to the second phase by changing the switch states of all of the switches in the switch units 16, 40 and the switches 52, 54, 72 of the hold circuit 44. More specifically, the ninety degree shift in the input terminals in FIG. 2 illustrates phase two of the sample and hold operation wherein switches 16-1, 16-2 of the switch unit connect to terminals B, D of the first Hall effect sensor 12 and switches 16-3, 16-4 connect to terminals B, D of the second Hall effect sensor 14. The bias circuits (not shown) provide bias current flowing from terminal D to terminal B by changing corresponding switch states.

In phase two, the operation amplifier 20 provides a positive output on the positive terminal of amplifier 20 that is defined by the equation: V1(phase two)=−Vhall1+Voffset1, wherein V1 is the sensed voltage of the amplifier 20 during phase two, and wherein Vhall1 is the Hall voltage value and Voffset1 is a voltage offset value of the sensed voltage of the Hall effect sensor 12 during phase two. Thus, the measured voltage V1(phase two) corresponds to a magnetic field strength value and a offset error value for the Hall effect sensor 12 during phase two.

At the same time, the operational amplifier 22 receives voltage signals from terminal B and terminal D of the Hall effect sensor 14 via respective switches 16-3 and 16-4. The operation amplifier 22 provides a positive output on the positive terminal of amplifier 22 that is defined by the equation: V2(phase two)=−Vhall2+Voffset2, wherein V2 is the sensed voltage of the amplifier 22 during phase two, and wherein Vhall2 is the Hall voltage value and Voffset2 is a voltage offset value of the sensed voltage of the Hall effect sensor 14 during phase two. Thus, the measured voltage V2(phase two) corresponds to a magnetic field strength value and a offset error value for the Hall effect sensor 14 during phase two.

Thereafter, adder 24 adds the voltage output V1(phase two) from amplifier 20 with the negative voltage output from amplifier 22 for V2(phase two) as the adder is connected to the negative output terminal of the amplifier 22. Thus, the adder 24 provides an output signal defined by the equation: Vp(phase two)=−(Vhall1−Vhall2)+(Voffset1−Voffset2). The combined sensed voltage Vp(phase two) corresponds to a magnetic field strength value and a offset error value.

At the same time, adder 26 adds the positive voltage output V2(phase two) from amplifier 22 with the negative voltage output for V1(phase two) as the adder is connected to the negative output terminal of the amplifier 20. Thus, the adder 26 provides an output signal defined by the equation: Vn(phase two)=(Vhall1−Vhall2)−(Voffset1−Voffset2). The combined sensed voltage Vn(phase two) corresponds to a magnetic field strength value and a offset error value.

During the second phase, the capacitor 50 is charged to correspond to a value of Voutput=−(Vp(phase one)−Vn (phase one))−(Vn(phase two)−Vp(phase two)). Thus, Voutput=−4(Vhall1−Vhall2). This voltage value corresponds to the difference of magnetic field strength between the locations of the two Hall effect sensors 12, 14. More specifically, the summed voltage from the first phase and second phase removes the magnetic field offset error values to obtain a summed voltage corresponding to a magnetic field strength value of the Hall effect sensor 12 minus the magnetic field strength value of the Hall effect sensor 14.

The Voutput value is essentially maintained or held for the following phase one cycle of the Hall effect sensor circuit arrangement 10. Thus, as shown in FIG. 3, the adjustments over time of the sampling and holding events of the sensor circuit arrangement 10 are smoothed, except for a minimal voltage transition when switching from phase two to sampling phase one.

Figure 3:
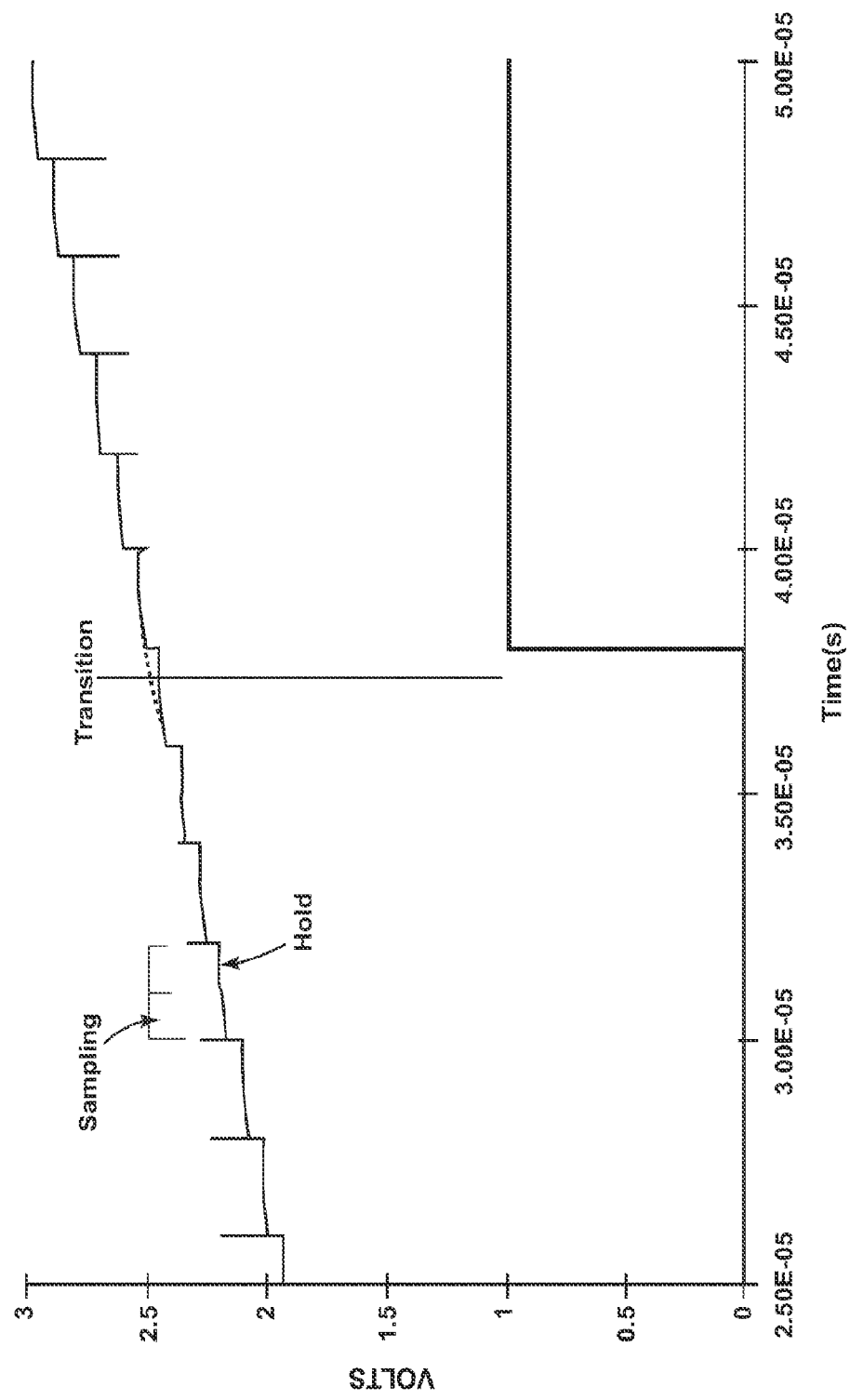
FIG. 3 is a graph showing voltage versus time during operation of the Hall sensor circuit arrangement.

As shown in FIG. 3, a sampling time period corresponding to phase one and a time period corresponding to phase two are each about, for example, one microsecond. Thus, the controller 90 switches the Hall effect sensor circuit arrangement 10 at a rate that minimizes the amount of voltage discharged by the capacitors during operation of the Hall effect sensor circuit arrangement 10.

The Hall effect sensor circuit arrangement 10 includes the comparator 80 that compares the output of the amplifier 60 with a predetermined voltage value from the voltage reference generator 82 that corresponds to a desired magnetic field value for the difference between the Hall voltages of the Hall effect sensors 12, 14. When the voltage difference that is output by the output amplifier 60 exceeds the value of, for example, 2.5 volts as shown in FIG. 3, the comparator 80 provides an output 84 having a value of one volt indicating that the sensed magnetic field exceeds the predetermined voltage value. The one volt value is maintained until the output 62 of the amplifier 60 is a value of less than 2.5 volts, which sets the comparator output 84 to zero volts.

In one embodiment, changes in the difference between the magnetic field strengths of the Hall effect sensors 12, 14 are counted by a circuit connected to the comparator output 84 to determine motion of rotating magnets that are following a path adjacent or near the Hall effect sensors. Thus, a rotating speed value or a position of a rotating shaft, or other device having magnets mounted thereon, is determined.

Second Embodiment

Figure 4:
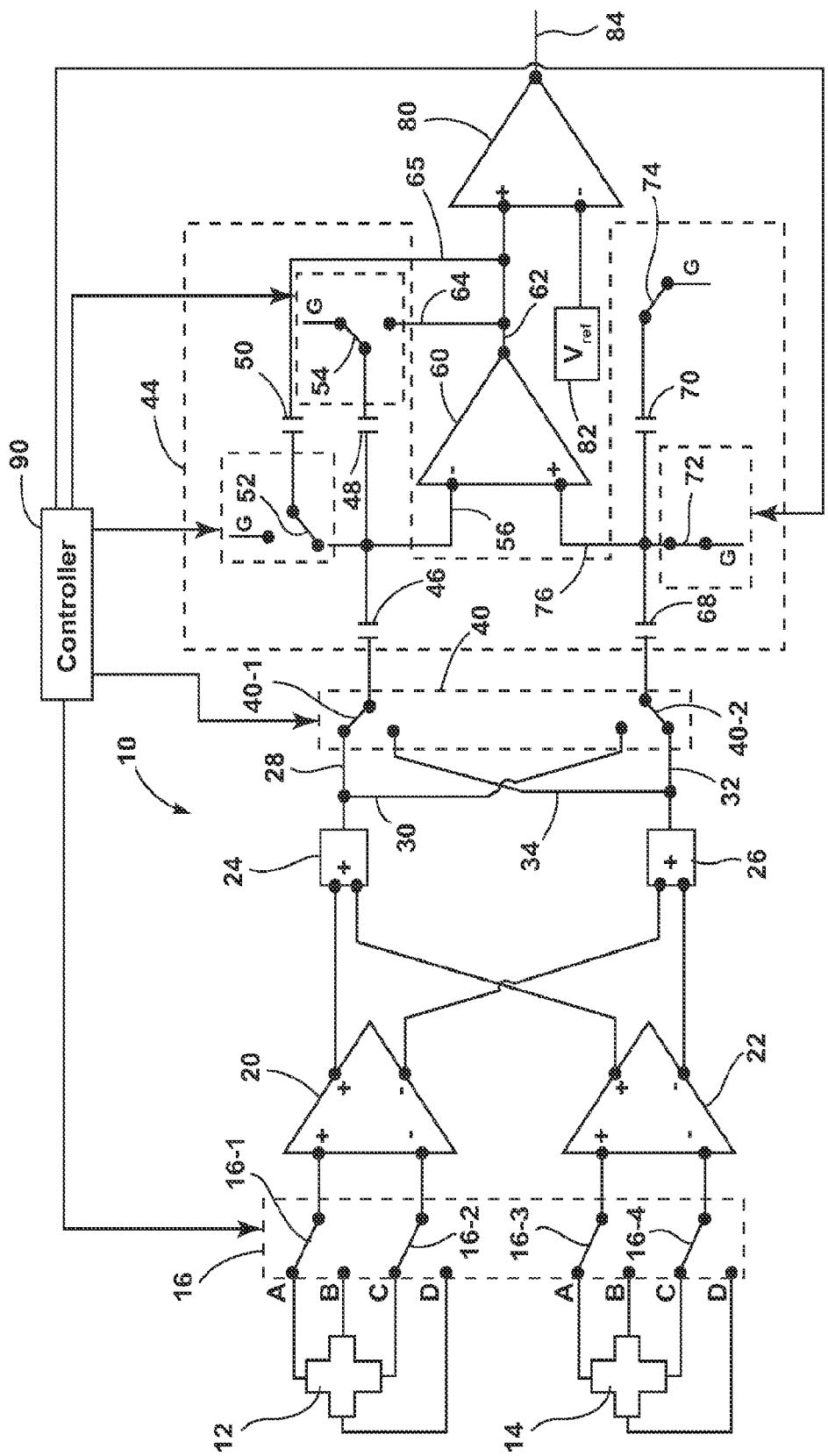
FIG. 4 shows another embodiment of a Hall sensor circuit arrangement during a first phase.
Figure 5:
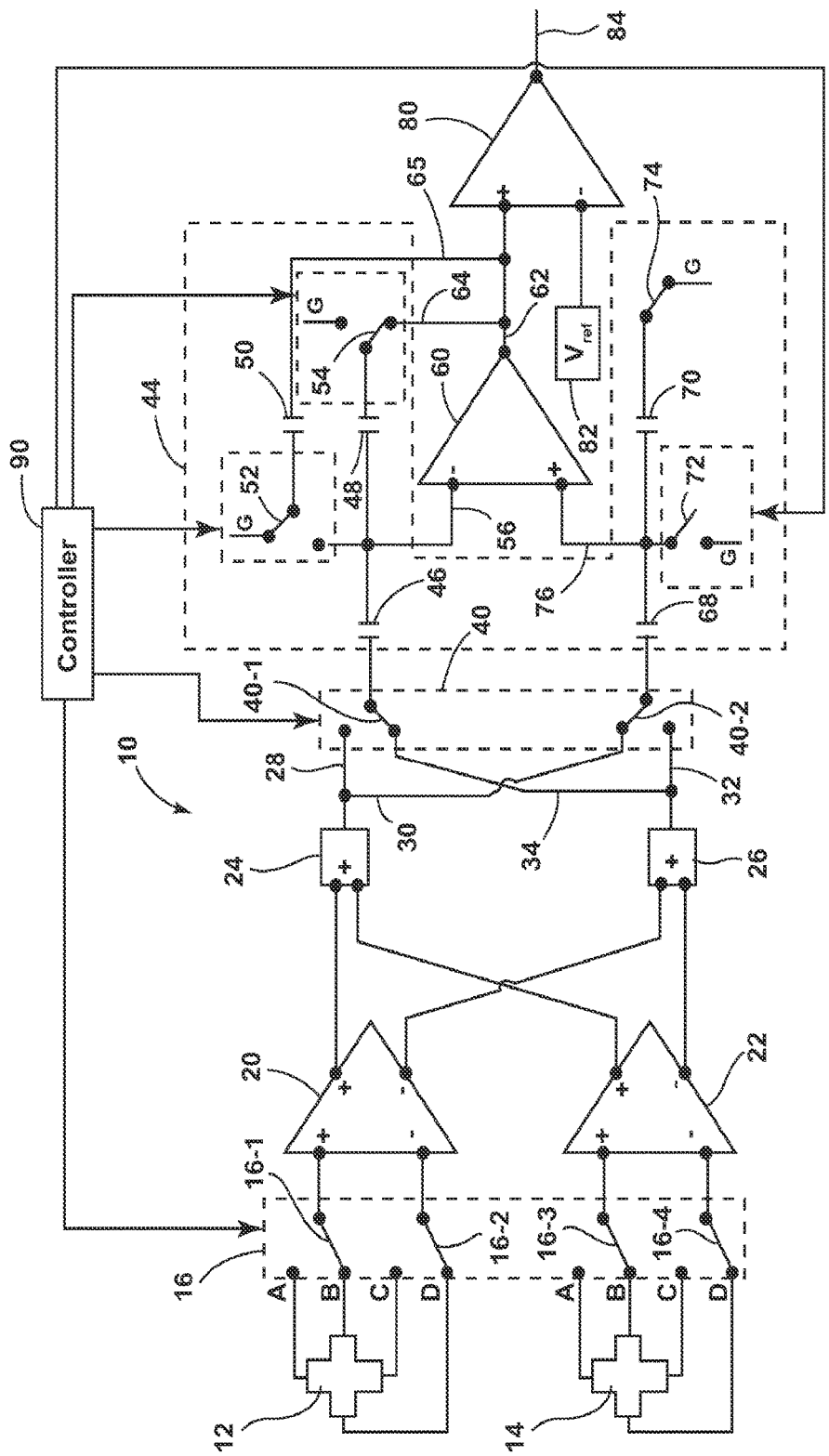
FIG. 5 shows the Hall sensor circuit arrangement of FIG. 4 during a second phase.

FIGS. 4 and 5 show a Hall effect sensor circuit arrangement 10 that is directed to another embodiment of the invention, which is very similar to the embodiment in FIGS. 1 and 2. Thus, the circuit elements are listed with the same reference numerals. The only difference in the circuitry of the embodiments of FIGS. 4 and 5 from FIGS. 1 and 2 is the operational amplifier 22. The operational amplifier 22 has the positive output connected to the adder 24, instead of a negative output as in FIGS. 1 and 2. Likewise, the amplifier 22 has a negative output connected to the adder 26, instead of the positive output as in FIGS. 1 and 2.

Due to the changing of the output of the amplifier 22 in FIGS. 4 and 5, the Hall effect sensor circuit arrangement 10 adds and subtracts the Hall voltages in an opposite manner. The calculations to obtain the sum of the Hall voltages of the Hall effect sensors 12, 14 is obtained in essentially the same manner as described in detail with respect to the embodiment illustrated in FIGS. 1 and 2. For instance, Vp(phase one)=(Vhall1+Vhall2)+(Voffset1+Voffset2), wherein Vp represents the combined voltage output by the adder 24. Vn(phase one)=−(Vhall1−Vhall2)+(Voffset1−Voffset2), wherein Vn(phase one) is output by the adder 26. The equations for Vp(phase two) and Vn(phase two) follow a similar pattern. Thus, the end result is that the Hall voltages of the Hall effect sensors Vhall1 and Vhall2 are added. Therefore, the final voltage at the end of the second phase is Voutput=−4(Vhall1+Vhall2). Accordingly, the value of Voutput corresponds to the addition of the magnetic field strength of the two Hall effect sensors 12, 14. More specifically, the summed voltage from the first phase and the second phase removes the magnetic field offset error values to obtain a summed voltage corresponding to a magnetic field strength value of the Hall effect sensor 12 added with the magnetic field strength value of the Hall effect sensor 14.

In some embodiments, the summed values of the Hall effect sensor voltages are compared with a reference voltage provided by the voltage reference generator 82 to the comparator 80. The reference voltage has a voltage value to determine proper transitions. As in the first embodiment, the transitions with respect to a predetermined voltage can provide speed of rotation of magnets mounted to a shaft relative to the Hall effect sensors 12, 14 or other conditions.

Third Embodiment

Figure 6:
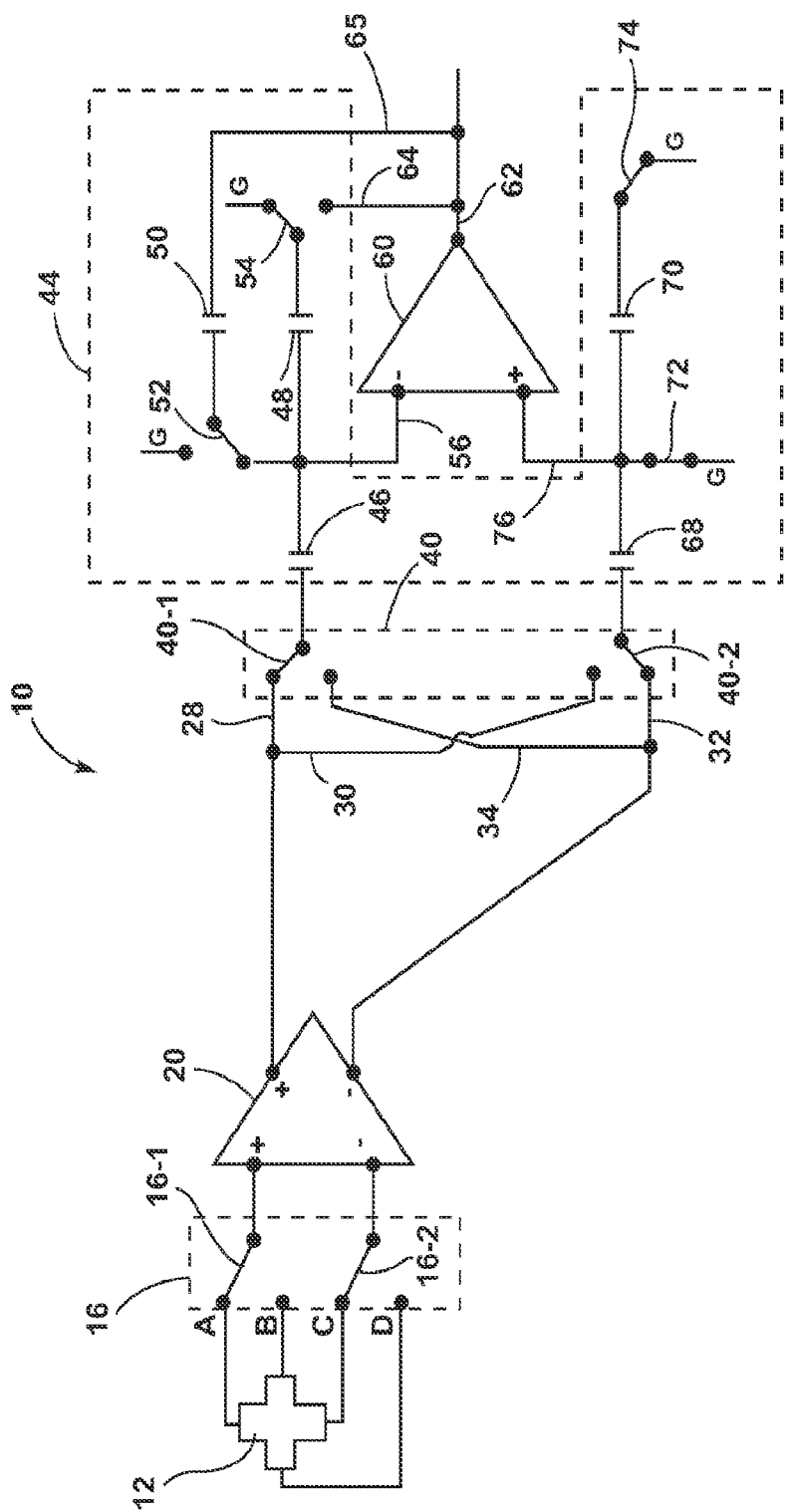
FIG. 6 shows yet another embodiment of a Hall sensor circuit arrangement during a first phase.
Figure 7:
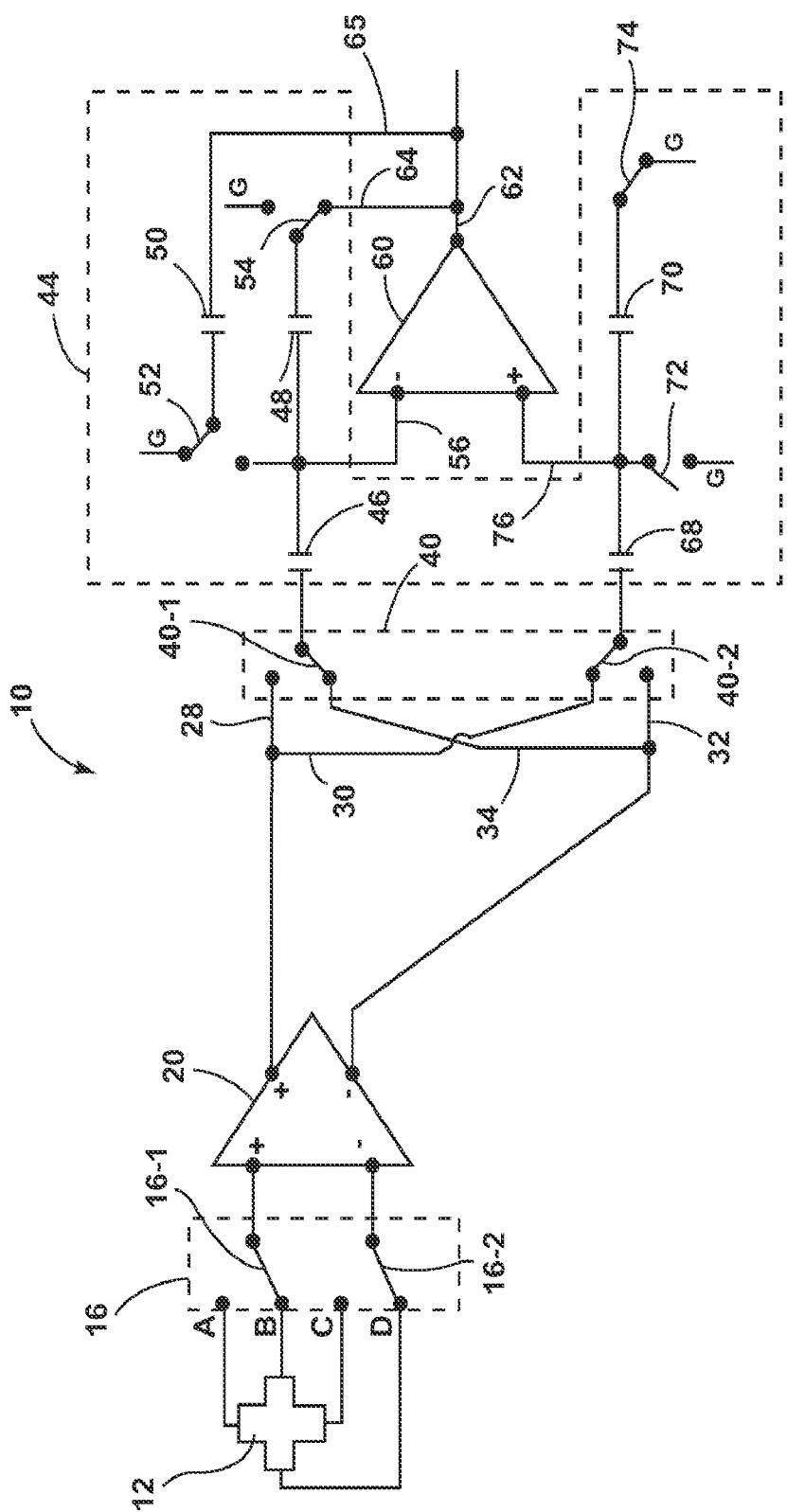
FIG. 7 shows the Hall sensor circuit arrangement of FIG. 6 during a second phase.

FIGS. 6 and 7 show a Hall effect sensor circuit arrangement 10 that is directed to another embodiment of the invention, which is similar to portions of the above embodiments, except that a single Hall effect sensor is utilized with offset compensation. Since a single Hall effect sensor is provided, the adders 24, 26 and other elements are not needed. Due to the similarities of the arrangements, the circuit elements are listed with the same reference numerals. In FIG. 6, a cross-shaped Hall effect sensor 12 senses the presence/absence and strength of a magnetic field. The Hall effect sensor 12 includes terminals A-D connected to four arms thereof. A switch unit 16 includes a pair of switches 16-1, 16-2 that connect the terminals A-D of the Hall effect sensor 12 to an operational amplifier 20. A bias circuit (not shown) connects to terminal C-A to provide bias current flowing from terminal C to terminal A. The operational amplifier 20 includes a positive and a negative voltage input, along with a positive and a negative voltage output.

Output connectors 28, 30, 32, 34 connect the respective outputs of the amplifier 20 to a switch unit 40. As shown in the Hall effect sensor circuit arrangement of FIG. 6, the switch unit 40 includes a first switch 40-1 that is selectively connectable to either the output connector 28 of the positive output of the operational amplifier 20 or the output connector 34 of the negative output of the operational amplifier 20. The switch unit 40 includes a second switch 40-2 that is selectively connectable to either the output connector 32 of the negative output of the operational amplifier 20 or the output connector 30 of the positive output of the operational amplifier.

In FIG. 6, the output of the switch 40-1 connects to a hold circuit 44. The hold circuit 44 includes capacitors 46, 48, 50 and switches 52, 54. As shown in FIG. 6, an output connector 56 of the hold circuit 44 connects to a negative input terminal of an operational output amplifier 60 that includes an output connector or signal line 62. Further, electrical connectors 64, 65 of the hold circuit 44 connect to the signal line 62.

The hold circuit 44 shown in FIG. 6 also includes a pair of capacitors 68, 70 and a switch 72. A switch 74 shown within the hold circuit 44 remains in the closed position throughout operation of the sensor circuit arrangement 10, and thus is not considered a component thereof. An output connector 76 of the hold circuit 44 connects to the positive input of the operational output amplifier 60. In FIG. 6, "G" is an abbreviation for a ground terminal.

The Hall effect sensor circuit arrangement 10 includes a controller (not shown) that is connected to the switch unit 16, the switch unit 40, the switch 52, the switch 54 and the switch 72. The controller is configured to control the states of the switch units 16, 40 and the switches 52, 54, 72.

FIG. 6 shows the Hall effect sensor circuit arrangement 10 in a sensing phase one, wherein sensing occurs with the switch units 16, 40 and the switches 52, 54, 72 in the states as shown. FIG. 7 shows the Hall effect sensor circuit arrangement 10 in sensing phase two, wherein the states of the switch units and switches are changed or switched by the controller to opposite states as compared to the states shown in FIG. 6. The sensor circuit arrangement 10 shown in FIGS. 6 and 7 obtains a difference signal value that is the difference in the magnetic field strength of the Hall effect sensor 12.

Operation

The Hall effect sensor circuit arrangement 10 shown in FIG. 6 operates as follows. The operational amplifier 20 receives voltage signals from terminal A and terminal C of the Hall effect sensor 12 via respective switches 16-1 and 16-2. The operational amplifier 20 provides a positive voltage output on the positive output terminal of amplifier 20 that is defined by the equation: V1(phase one)=Vhall1+Voffset1, wherein V1 is the sensed voltage of the amplifier 20 during phase one, and wherein Vhall1 is the Hall voltage value and Voffset1 is a voltage offset value of the sensed voltage of the Hall effect sensor 12 and amplifier 20 during sampling phase one. Thus, the measured voltage V1(phase one) corresponds to a magnetic field strength value and a Hall effect sensor and amplifier offset error value for the Hall effect sensor 12 during phase one.

At the same time, the operational amplifier 20 outputs a negative voltage output on the negative terminal having a value of −V1(phase one)=−(Vhall1+Voffset1).

As shown in FIG. 6, the voltage output V1(phase one) passes through switch 40-1 of switch unit 40 to the hold circuit 44 during phase one. With the switch 54 connected to an electrical ground (GND) during phase one, the voltage V1 is provided to capacitors 46, 48 provided in series. Between the capacitors 46, 48 the hold circuit 44 has an output connection 56 to a negative input terminal of the operational amplifier 60. The capacitor 46 receives and holds the voltage output V1 that is provided to the amplifier 60 as a generally constant voltage value. The capacitor 48 is connected to GND via switch 54 and discharges during phase one. At the same time, the switch 72 of the hold circuit 44 is positioned to connect ground GND to the output connector 76 that connects with the positive input of the operational amplifier. Thus, the capacitor 70 is discharging during phase one, along with the capacitor 48.

Further, as shown in FIG. 6, during the first phase the output of the amplifier 60 is in a voltage hold condition wherein the voltage across capacitor 50 receives and maintains the output voltage from a previous completion of phase two. For purposes of discussion, amplifier gains are ignored in the equations.

Phase Two

As shown in FIG. 7, a controller (not shown) switches to the second phase by changing the switch states of the switches in the switch units 16, 40 and the switches 52, 54, 72 of the hold circuit 44. More specifically, the ninety degree shift in the input terminals in FIG. 7 illustrates phase two of the sample and hold operation wherein switches 16-1, 16-2 of the switch unit 16 connect to terminals B, D of the first Hall effect sensor 12. The bias circuit (not shown) provides bias current flowing from terminal D to terminal B by changing corresponding switch states.

In phase two, the operation amplifier 20 provides a positive output on the positive output terminal of amplifier 20 that is defined by the equation: V1(phase two)=−Vhall1+Voffset1, wherein V1 is the sensed voltage of the amplifier 20 during phase two, and wherein Vhall1 is the Hall voltage value and Voffset1 is a voltage offset value of the sensed voltage of the Hall effect sensor 12 and the amplifier 20 during phase two. Thus, the measured voltage V1(phase two) corresponds to a magnetic field strength value and a Hall effect sensor and amplifier offset error value for the Hall effect sensor 12 during phase two.

During the second phase, the capacitor 50 is charged to correspond to a value of Voutput=−(Vp(phase one)−Vn (phase one))−(Vn(phase two)−Vp(phase two)). Thus, Voutput=−4(Vhall1). This voltage value corresponds to the difference of magnetic field strength between the switch positions of the Hall effect sensor 12. More specifically, the summed voltage from the first phase and second phase removes the Hall effect sensor and amplifier offset error value to obtain a summed voltage corresponding to a magnetic field strength value of the Hall effect sensor 12.

The Voutput value is essentially maintained or held for the following phase one cycle of the Hall effect sensor circuit arrangement 10. Thus, the adjustments over time of the sampling and holding events of the sensor circuit arrangement 10 are smoothed, except for a minimal voltage transition when switching from phase two to sampling phase one. The sampling time period corresponding to phase one and a time period corresponding to phase two are each about one microsecond. Thus, the controller switches the Hall effect sensor 12 at a rate that minimizes the amount of voltage discharged by the capacitors during operation of the Hall effect sensor circuit arrangement 10. The single Hall effect sensor circuit arrangement may be utilized for various purposes as set forth above.

While the above three embodiments are disclosed, variations to the embodiments are contemplated. While a time period of 1 microsecond is shown for the sampling and holding periods of the Hall effect sensor circuit arrangement 10, different frequencies can be utilized. In some embodiments the frequencies of the sample and hold operation are greater than about 200 KHz, and in one embodiment the frequency is about 250 KHz.

While two Hall effect sensors 12, 14 are shown in the first and second embodiments, additional pairs of Hall effect sensors provided with a Hall effect sensor circuit arrangement are contemplated. The drive current for each Hall effect sensor 12, 14 switches along with the switch connections to the terminals A-D to provide the drive current so that the drive current is provided across the terminals each Hall effect sensor that is not sensing the Hall voltage.

While an application specific integrated circuit (ASIC) Hall effect sensor circuit arrangement 10 is disclosed, in some embodiments a digital processor can be programmed to perform the functions of the sensor circuit arrangement. A processor would replace the entire hold circuit 44, along with other components in some embodiments. While sampling occurs for essentially the entirety of the first phase in one analog circuit arrangement embodiment, in an embodiment with a digital processor or other processor, sampling may occur for a shorter time period and more frequently. Further, in other analog circuit arrangement embodiments, the sampling may occur for only a portion of the first phase.

In some embodiments, the output 84 of the comparator 80 is provided to an analog or digital processor (not shown). The processor calculates or counts the number of times the comparator 80 outputs/transitions to the one volt signal over time. Thus, speed of rotation for a shaft sensed by the Hall effect sensors 12, 14 is determined. The processor displays the speed and/or controls the speed of the shaft in response to the sensed rotation speed. Buses provide communication between the processor and other devices. In other embodiments, the comparator 80 itself, is replaced with an analog amplifier for further amplification, or an analog to digital converter or a digital processor.

In some embodiments, the amplifier 60 can have differential output by adding a capacitor between its negative output and switch 72

In some embodiments, output 64 of amplifier 60 is provided to an analog amplifier for further signal amplification. In some other embodiments, the output 64 of amplifier 60 is provided to an Analog to Digital converter to provide digital output. The digital output is provided to a processor for further processing.

In the third disclosed embodiment, a single Hall effect sensor is shown. In other embodiments three or another odd number of Hall effect sensors are provided.

Thus, the invention provides, among other things, a method and apparatus for sensing the Hall voltage of at least a pair of Hall effect sensors while removing offset voltage from the measured voltage. Thus, more accurate Hall voltage values are obtained. Further, a low pass filter is not required to account for the Hall effect sensor offset voltages. Various features and advantages of the invention are set forth in the following claims.

What is claimed is:

1. A method for sensing a magnetic field with at least one Hall effect sensor connected to a Hall effect sensing circuit, the method comprising the steps of:
    applying a drive current to the at least one Hall effect sensor during a first phase;
    sampling a sensed phase one voltage for the at least one Hall effect sensor during the first phase;
    providing the sensed phase one voltage to an amplifier;
    outputting from the amplifier a positive voltage output of the sensed phase one voltage and a negative voltage output of the sensed phase one voltage to a hold circuit during the first phase, the positive voltage output and the negative voltage output corresponding to a magnetic field strength value and a Hall effect sensor and amplifier offset error value;
    switching terminals of the at least one Hall effect sensor and applying the drive current to different terminals of the at least one Hall effect sensor to begin a second phase;
    sampling a sensed phase two voltage for the at least one Hall effect sensor during the second phase at the different terminals of the at least one Hall effect sensor than during the first phase;
    providing the sensed phase two voltage to the amplifier;
    outputting from the amplifier a positive voltage output of the sensed phase two voltage and a negative voltage output of the sensed phase two voltage to the hold circuit during the second phase, the positive voltage output and the negative voltage output corresponding to a magnetic field strength value and a Hall effect sensor and amplifier offset error value; and
    summing the positive output and negative output voltages from the first phase with the positive output and negative output voltages from the second phase to remove the Hall effect sensor and amplifier offset error value and to obtain a summed voltage corresponding to a summed magnetic field strength value.

2. The method according to claim 1, with the at least one hall effect sensor comprising a first one of at least one pair of Hall effect sensors, wherein the summed magnetic field strength value corresponds to the Hall voltage of the first one of the pair of Hall effect sensors added to the Hall voltage of the second one of the pair of Hall effect sensors.

3. The method according to claim 1, wherein the summed magnetic field strength value is four times the actual magnetic field strength value.

4. The method according to claim 1, wherein the at least one Hall effect sensor comprises a first one of at least one pair of Hall effect sensors, wherein the summed magnetic field strength value corresponds to the Hall voltage of the first one of the pair of Hall effect sensors subtracted by the Hall voltage of the second one of the pair of Hall effect sensors.

5. The method according to claim 1, including the steps of subsequent to obtaining the summed magnetic field strength value:
    holding the summed voltage corresponding to the summed magnetic field strength value for a next first phase, and
    switching the terminals of the Hall effect sensor to correspond to the terminals of the first phase and applying the drive current to the at least one Hall effect sensor for repeating the first phase, and
    wherein repeating the first phase includes repeating the steps of:
    sampling a sensed phase one voltage for the at least one Hall effect sensor during the first phase;
    providing the sensed phase one voltage to an amplifier; and
    outputting from the amplifier a positive voltage output of the sensed phase one voltage and a negative voltage output of the sensed phase one voltage to the hold circuit during the first phase, the positive voltage output and the negative voltage output corresponding to a magnetic field strength value and a Hall effect sensor and amplifier offset error value.

6. The method of claim 1, wherein switching the terminals of the Hall effect sensors comprises switching the terminals at a switching frequency of 200,000 Hz.

7. The method of claim 2, wherein the at least one pair of Hall effect sensors comprises one of between two or more pairs of the Hall effect sensors, and wherein the summed voltages of the pairs of the Hall effect sensors are combined.

8. The method of claim 1, wherein the step of outputting from the amplifier a positive voltage output of the sensed phase two voltage and a negative voltage output of the sensed phase two voltage to the hold circuit during the second phase comprises:
    switching the positive voltage output and the negative voltage output so the negative voltage output during the second phase is provided to a first input of the hold circuit that receives the positive voltage output during the first phase and so that the positive voltage output during the second phase is provided to a second input of the hold circuit that receives the negative voltage output during the first phase; and wherein the step of summing the positive output and negative output voltages from the first phase with the positive output and negative output voltages from the second phase to remove the Hall effect sensor and amplifier offset error value and to obtain a summed voltage corresponding to a summed magnetic field strength value comprises:

providing the voltage from the first input of the hold circuit to a negative input of an operational amplifier;

providing the voltage from the second input of the hold circuit to a positive input of the operational amplifier; and providing the summed voltage corresponding to the summed magnetic field strength value as an output of the operational amplifier.

9. A method for sensing a magnetic field with at least one pair of Hall effect sensors connected to a Hall effect sensing circuit, the method comprising the steps of:

applying a drive current to the at least one pair of Hall effect sensors during a first phase;

sampling a sensed voltage for each of the Hall effect sensors during the first phase;

combining the sensed voltage from the Hall effect sensors during the first phase to obtain a first combined sensed voltage corresponding to a magnetic field strength value and a Hall effect sensor and amplifier offset error value;

providing the first combined sensed voltage to a hold circuit switching terminals of the Hall effect sensors and applying the drive current to different terminals of the at least one pair of Hall effect sensors to begin a second phase;

sampling a sensed voltage for each of the Hall effect sensors during the second phase at different terminals of the at least one pair of Hall effect sensors than during the first phase;

combining the sensed voltage from the Hall effect sensors during the second phase to obtain a second combined sensed voltage corresponding to a magnetic field strength value and Hall effect sensor and amplifier offset error value, providing the second combined sensed voltage to the hold circuit, and summing the first combined sensed voltage from the first phase with the second combined sensed voltage during the second phase to remove the Hall effect sensor and amplifier offset error value and to obtain a summed voltage corresponding to a summed magnetic field strength value.

10. The method according to claim 9, wherein the summed magnetic field strength value corresponds to the Hall voltage of a first one of the pair of Hall effect sensors added to the Hall voltage of the second one of the pair of Hall effect sensors.

11. The method according to claim 10, wherein the summed magnetic field strength value is four times the actual magnetic field strength value.

12. The method according to claim 9, wherein the summed magnetic field strength value corresponds to the Hall voltage of a first one of the pair of Hall effect sensors subtracted by the Hall voltage of the second one of the pair of Hall effect sensors.

13. The method according to claim 9, including the steps of subsequent to obtaining the summed magnetic field strength value:

holding the combined sensed voltage for a next first phase, and switching the terminals of the Hall effect sensors to correspond to the terminals of the first phase and applying the drive current to the at least one pair of Hall effect sensors for repeating the first phase, and wherein repeating the first phase includes repeating the steps of:

sampling the sensed voltage for each of the Hall effect sensors during the first phase, and combining the sensed voltages from the Hall effect sensors during the first phase to obtain the first combined voltage corresponding to a magnetic field strength value and a Hall effect sensor and amplifier offset error value.

14. The method of claim 9, wherein switching the terminals of the Hall effect sensors comprises switching the terminals at a switching frequency of 200,000 Hz.

15. The method of claim 10, wherein the at least one pair of Hall effect sensors comprises one of between two or more pairs of the Hall effect sensors, and wherein the sensed voltages of the pairs of the Hall effect sensors are combined.

16. A Hall effect sensing circuit arrangement comprising:
first and second Hall effect sensors having terminals;
first and second amplifiers;
a first switching unit configured to selectively connect the terminals of the first Hall effect sensor to inputs of the first amplifier, and the first switching unit configured to selectively connect the terminals of the second Hall effect sensor to inputs of the second amplifier;
first and second adders for receiving outputs from the first and second amplifiers;
a second switching unit configured to connect an output of the first adder to a hold circuit and alternately to connect an output of the second adder to the hold circuit, wherein the hold circuit comprises capacitors and switches;
an output amplifier for receiving a voltage input from the hold circuit and the adders to obtain a combined sensed voltage, and
a controller configured to control the first switching unit and the second switching unit,
wherein the controller is configured to: operate the sensing circuit arrangement in a first phase and a second phase by periodically changing a state of the first switching unit and the second switching unit, and change a state of switches in the hold circuit when switching between the first phase and the second phase, the changing of the state of switches in the hold circuit occurring essentially simultaneously with the changing of the states of the first switching unit and the second switching unit.

17. The sensing circuit arrangement of claim 16, wherein the sensing circuit arrangement determines the combined sensed voltage from the first phase and the second phase and removes a Hall effect sensor and amplifier offset error value, the combined sensed voltage comprising a summed voltage corresponding to a summed magnetic field strength value for the pair of Hall effect sensors.

18. The sensing circuit of claim 17, wherein the summed magnetic field strength value corresponds to a Hall voltage of the first Hall effect sensor added to a Hall voltage of the second Hall effect sensor.

19. The sensing circuit of claim 17, wherein the summed magnetic field strength value corresponds to a Hall voltage of the first Hall effect sensor subtracted from a Hall voltage of the second Hall effect sensor.

20. The sensing circuit arrangement of claim 16, wherein the first adder receives a positive output from the first amplifier and a negative output from the second amplifier, and wherein the second adder receives a positive output from the second amplifier and a negative output from the first amplifier.

21. The sensing circuit arrangement of claim 16, wherein the first adder receives a positive output from the first amplifier and a positive output from the second amplifier, and wherein the second adder receives a negative output from the second amplifier and a negative output from the first amplifier.

22. The sensing circuit arrangement of claim 16, wherein the sensing circuit arrangement is free from a low pass filter.

23. The sensing circuit arrangement of claim 16, wherein the first and second Hall effect sensors comprise one pair of between two or more pairs of the Hall effect sensors, and wherein the sensed voltages of the pairs of the Hall effect sensors are combined.

24. The sensing circuit arrangement of claim 16, further comprising a comparator having a first input for receiving a reference voltage and a second input for receiving the output of the output amplifier.

25. The sensing circuit arrangement of claim 16, wherein the first adder provides a first adder voltage output during the first phase of Vp(phase one)=(Vhall1−Vhall2)+(Voffset1−Voffset2), wherein Vp(phase one) represents the added voltage output of the first adder, Vhall1 is the Hall voltage value and Voffset1 is a voltage offset value of the sensed voltage of the first Hall effect sensor during the first phase, and wherein Vhall2 is the Hall voltage value and Voffset2 is a voltage offset value of the sensed voltage of the second Hall effect sensor during the first phase.

26. The sensing circuit arrangement of claim 25, wherein the second adder provides a second adder voltage output during the first phase of Vn(phase one)=−(Vhall1−Vhall2)−(Voffset1−Voffset2), wherein Vn represents the added voltage output of the second adder, and Vhall1 is the Hall voltage value and Voffset1 is a voltage offset value of the sensed voltage of the first Hall effect sensor during the first phase, and wherein Vhall2 is the Hall voltage value and Voffset2 is a voltage offset value of the sensed voltage of the second Hall effect sensor during the first phase.

27. The sensing circuit arrangement of claim 26, wherein the first adder provides a first adder voltage output during the second phase of Vp(phase two)=−(Vhall1 Vhall2)+(Voffset1−Voffset2), wherein Vp(phase two) represents the added voltage output of the first adder during the second phase, Vhall1 is the Hall voltage value and Voffset1 is a voltage offset value of the sensed voltage of the first Hall effect sensor during the second phase, and wherein Vhall2 is the Hall voltage value and Voffset2 is a voltage offset value of the sensed voltage of the second Hall effect sensor during the second phase.

28. The sensing circuit arrangement of claim 27, wherein the second adder provides a second adder voltage output during the second phase of Vn(phase two)=(Vhall1−Vhall2)−(Voffset1−Voffset2), wherein Vn(phases two) represents the added voltage output of the second adder during the second phase, and Vhall1 is the Hall voltage value and Voffset1 is a voltage offset value of the sensed voltage of the first Hall effect sensor during the second phase, and wherein Vhall2 is the Hall voltage value and Voffset2 is a voltage offset value of the sensed voltage of the second Hall effect sensor during the second phase.

29. The sensing circuit arrangement of claim 28, wherein during the second phase, the hold circuit is charged to correspond to a value of Voutput=−(Vp(phase one)−Vn(phase one))−(Vn(phase two)−Vp(phase two)).

30. The sensing circuit arrangement of claim 16, wherein the first adder provides an adder voltage output during the first phase of Vp(phase one)=(Vhall1+Vhall2)+(Voffset1+Voffset2), wherein Vp(phase one) represents the added voltage output of the first adder, Vhall1 is the Hall voltage value and Voffset1 is a voltage offset value of the sensed voltage of the first Hall effect sensor during the first phase, and wherein Vhall2 is the Hall voltage value and Voffset2 is a voltage offset value of the sensed voltage of the second Hall effect sensor during the first phase.

* * * * *